US 7,009,187 B2

(12) United States Patent
Gerlach et al.

(10) Patent No.: US 7,009,187 B2
(45) Date of Patent: Mar. 7, 2006

(54) PARTICLE DETECTOR SUITABLE FOR DETECTING IONS AND ELECTRONS

(75) Inventors: Robert L. Gerlach, Portland, OR (US);
Mark W. Utlaut, Scappoose, OR (US);
Trevor Dingle, Bluntisham (GB);
Marek Uncovsky, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 10/606,930

(22) Filed: Jun. 26, 2003

(65) Prior Publication Data

US 2004/0262531 A1     Dec. 30, 2004

Related U.S. Application Data

(60) Provisional application No. 60/402,010, filed on Aug. 8, 2002.

(51) Int. Cl.
*G01K 1/08*        (2006.01)
(52) U.S. Cl. ................. 250/397; 250/398; 250/399
(58) Field of Classification Search .......... 250/310, 250/399, 398, 397
See application file for complete search history.

(56) References Cited

U.S. PATENT DOCUMENTS

| 3,538,328 A | | 11/1970 | Strausser | |
|---|---|---|---|---|
| 3,894,233 A | * | 7/1975 | Tamura et al. | 250/307 |
| 4,101,771 A | | 7/1978 | Hofer et al. | |
| 4,320,295 A | * | 3/1982 | Eloy | 250/281 |
| 4,322,629 A | * | 3/1982 | Eloy et al. | 250/299 |
| 5,463,218 A | * | 10/1995 | Holle | 250/281 |
| 5,866,901 A | * | 2/1999 | Penn et al. | 250/281 |
| 6,051,831 A | * | 4/2000 | Koster | 250/281 |
| 6,828,729 B1 | * | 12/2004 | Owens et al. | 313/528 |
| 6,906,318 B1 | * | 6/2005 | Bateman et al. | 250/281 |
| 2004/0061054 A1 | * | 4/2004 | Kondo et al. | 250/310 |

FOREIGN PATENT DOCUMENTS

| JP | 63-071880 | | 4/1988 |
|---|---|---|---|
| JP | 63071680 | * | 4/1988 |
| JP | 07-142022 | | 6/1995 |

OTHER PUBLICATIONS

Axel Pramann and Klaus Rademann, "A New Scintilation-Type Time-of-Flight Anion Detector," Review of Scientific Instruments, vol. 72, No. 8, pp. 3475-3478, Agust 2001, 2001 American Institute of Physics.

N. R. Daly, "Scintillation Type Mass Spectrometer Ion Detector," Review of Scientific Instruments, vol. 31, No. 3, pp. 264-267, Mar. 1960.

* cited by examiner

*Primary Examiner*—Nikita Wells
*Assistant Examiner*—Anthony Quash
(74) *Attorney, Agent, or Firm*—Michael O. Scheinberg

(57) ABSTRACT

A particle detector switchable from an ion detector to an electron detector includes an ion-to-electron converter and a scintillator detector. With one set of voltages on the components, the converter has minimal impact on the electron trajectories so the electrons are efficiently detected by the scintillator detector. With different voltage settings on the components, the detector can be operated in positive ion mode to collect positive ions with adequate efficiency for most FIB applications. The ion-to-electron converter is preferably in the shape of a cylinder or includes multiple parallel plates

21 Claims, 5 Drawing Sheets

PARTICLE DETECTOR SUITABLE FOR DETECTING IONS AND ELECTRONS

This application claims the benefit of provisional application No. 60/402,010 filed Aug. 8, 2002.

TECHNICAL FIELD OF THE INVENTION

The present invention relates to particle detectors and in particular to a particle detector that can convert ions to electrons for detection.

BACKGROUND OF THE INVENTION

Scanning electron microscopes (SEMs) direct a beam of electrons toward an object under observation and then detect secondary electrons emitted from the work piece. SEMs typically employ scintillator detectors for detecting secondary electrons emitted from the object being observed. When electrons impact material within the scintillator detector, the material emits a flash of light, that is, it scintillates. The flash of light is detected by a photon detector, such as a photomultiplier tube, which converts the light into an electric signal. Scintillator detectors are robust, stable and long lasting.

Focused ion beam (FIB) systems, on the other hand, direct a focused beam of ions toward a work piece. Because the ions in the beam are much more massive than the electrons in the primary beam of the SEM, the impact of the ions in the beam ejects from the work piece positive and negative ions, as well as electrons. To detect secondary particles, FIB systems typically use either a channel electron detector or a channel plate electron detector. By changing the electric potential of these detectors relative to the work piece, these detectors can be adjusted to detect either ions or electrons. The term "focused ion beam system" is used to also include a systems, commonly called a "dual beam systems," which are typically equipped with both focused electron and focused ion sources.

Channel electron detectors typically comprise a curved tube with a cone at the entrance. The incoming ions or electrons strike the cone or the tube and cause the emission of secondary electrons, which in turn cause a cascade of additional electrons as the particles bounce off the sides on the curved tube. The electron current at the end of the tube is sufficiently great to be detected and amplified in a pre amplifier. Channel plate detectors comprise a thin plate having numerous small holes through the plate wherein each hole acts as a miniature channel electron multiplier or detector. Channel plates may be stacked for additional gain and to reduce ion feedback. The performance of channel electron detectors and channel plate detectors degrade over time. Also, the preamplifier for the channel electron multiplier or channel plate must be electrically floated, which makes the electronics more complex and prone to high voltage leakage currents generating detector output signal current instability.

When a channel plate detector is used in a FIB system, the detector is typically positioned below the objective lens of a FIB system and centered on the beam axis. The detector has a hole in the center to pass the primary ion beam and collects electrons or ions coaxially about the primary ion beam.

Mass spectrometers are instruments that determine the mass of particles. Mass spectrometers typically have two main components: a mass analyzer that separates particles according to their charge-to-mass ratio and a particle detector that detects the separated particles. In the mass analyzer, particles move through an electric field, a magnetic filed or combined magnetic and electric fields. The field separates the particles by altering their trajectories, depending upon their charge-to-mass ratio. The particle detector detects particles whose trajectories enter the detector. The detector has a small opening to accept a limited trajectory range in order to provide a high resolution of the charge-to-mass ratio. An ion detector in a FIB system, on the other hand, typically accepts particles over a large input angle.

Some mass spectrometers detect ions by using a structure that, when struck by ions, ejects electrons, which are then detected. Such a structure is referred to as an "ion-to-electron converter." Generally speaking, these converters comprise a negatively charged, off-axis plate positioned to the side of the entering beam to be mass analyzed. The ions strike this plate to generate secondary electrons, which are detected by an electron multiplier.

U.S. Pat. No. 3,538,328 to Strausser describes such a detector that detects ions by generating electrons from the ion impact. Strausser describes a cone-shaped ion-to-electron converter placed around a narrow ion beam, with the wide side of the cone facing a scintillator electron detector. With the cone at a potential of between −0.1 kV and −10 kV, the positive ion beam enters the narrow end of the cone, the ions are reflected by the scintillator at ground potential and strike the inside surface of the cone. Secondary electrons produced at the cone surface by the ion impact are attracted to the scintillator. U.S. Pat. No. 4,101,771 to Hofer et al. builds upon the Strausser concept for ion detection by using a spherical surface facing a scintillator or semiconductor electron detector.

Ion-to-electron type detectors are not typically employed in focused ion beam systems because they cannot efficiently detect both electrons and ions. The efficiency of a detector is the ratio of the number of particles detected to the number of particles arriving at the detector.

Scintillators can be used to directly detect ions by maintaining the scintillator disk at a potential of about −10 kV to attract positive ions and convert their energy to photons. The ion-to-photon detection process is not very efficient, however. In addition, the impact of the ions on the scintillator significantly shortens the working life of the detector compared to that of a scintillator detector that detects primarily electrons.

SUMMARY OF THE INVENTION

An object of the invention is to provide a robust particle detector that can detect ions or electrons One aspect of the present invention includes a method and apparatus for detecting either ions or electrons by using an ion-to-electron converter to convert the ions to electrons and then using a scintillator detector or other electron detector to detect either electrons directly from the target or electrons generated in the ion-to-electron converter. Scintillator electron detectors can have a significantly longer service life than conventional channel electron or channel plate detectors.

The detector is particularly suitable for use in a focused ion beam system, including a dual beam system, for detecting both electrons and ions.

Another aspect of the invention comprises an ion-to-electron converter that can be configured to convert ions-to-electrons or to pass electrons.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed might be readily utilized as a basis for modifying or designing other structures for carrying out the same purposes as the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, the following description is made with reference to the accompanying drawings, in which.

DETAILED DESCRIPTION OF THE PREFERRED EMBODIMENTS

Figure 1:
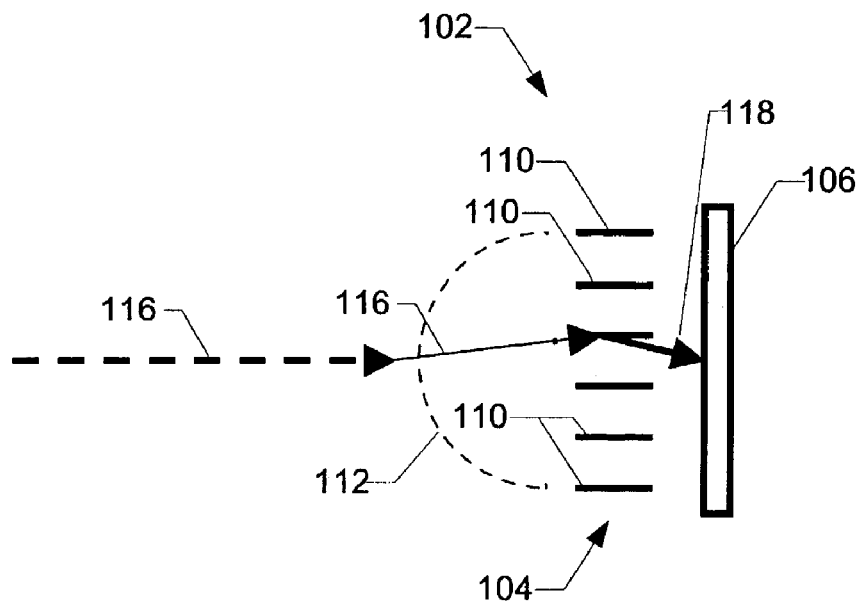
FIG. 1 shows a first embodiment of the present invention operating in an ion detection mode.

In the embodiment shown in FIG. 1, a particle detector 102 uses a "Venetian blind" ion-to-electron converter 104 in front of a conventional scintillator detector 106. Ion-to-electron converter 104 includes multiple converter plates 110, preferably parallel to each other, placed between a hemispherical input grid 112 and the scintillator detector 106. In positive ion collection mode, the input grid is negatively biased, preferably to about −250 V relative to a FIB target to attract low energy positive ions generated at the sample by the FIB.

The converter plates 110 are preferably maintained at an electrical potential of about −2000 V relative to the FIB target. This potential attracts positive ions 116 to the plates and accelerates them to about 2000 eV as they strike the converter plates 110. The ions striking the plates 110 cause electrons 118 to be emitted from the converter plates 110. The converter plates 110 are preferably constructed from a material, such as a metal oxide, that efficiently generates secondary electrons when struck by ions. In one embodiment, the plates are made of aluminum, which readily oxidizes to produce a thin surface layer of aluminum oxide. In another embodiment, the plates are constructed of a stainless steel. An electrical potential of about +10,000 V is applied to the front of the scintillator detector 106 to attract electrons 118 that are generated as the ions strike plates 110. Electrons 118 striking the scintillator disk are converted to photons and detected in a conventional manner.

Figure 2:
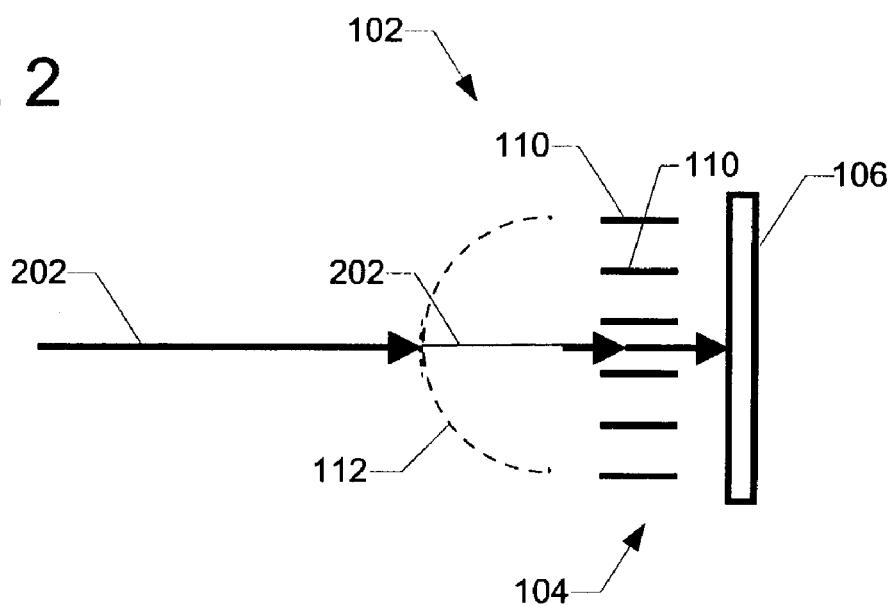
FIG. 2 shows the embodiment of FIG. 1 operating in an electron detection mode.

FIG. 2 shows particle detector 102 of FIG. 1 operated in an electron detection mode. In the electron detection mode, a positive potential of about 250 V is applied to input screen 112, a positive potential of about 500 V is applied to plates 110, and a positive potential of about 10,000 V is applied to scintillator detector 106. Electrons 202 are accelerated by the input grid 112 and then the converter plates 110. Although some electrons strike converter plates 110, other electrons pass through the converter plates and strike the scintillator directly.

Figure 3:
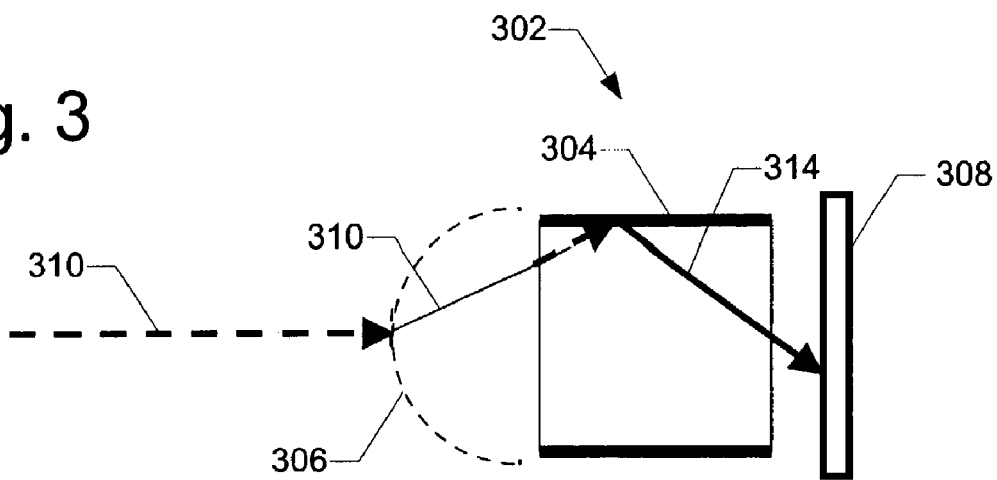
FIG. 3 shows a second embodiment of the present invention operating in an ion detection mode.

FIG. 3 shows another particle detector 302 embodying the present invention. Particle detector 302 uses a cylinder 304 positioned between a hemispherical input grid 306 and a scintillator disk 308. In one embodiment for detection of positive ions, input grid 306 is maintained at an electrical potential of approximately −250 V; cylinder 304 is maintained at an electrical potential of approximately −2000 V; and scintillator detector 308 is maintained at an electrical potential of approximately +10,000, all potentials given relative to the FIB target.

Positive ions 310 from the sample are attracted to input grid 306. Ions 310 are then attracted to the cylindrical converter 304. As ions 310 strike converter 304, they produce secondary electrons 314, many of which are attracted to the scintillator detector 308 by its relatively large positive potential. Scintillator 308 converts the electrons 314 to photons and detects the photons in a conventional manner.

Figure 4:
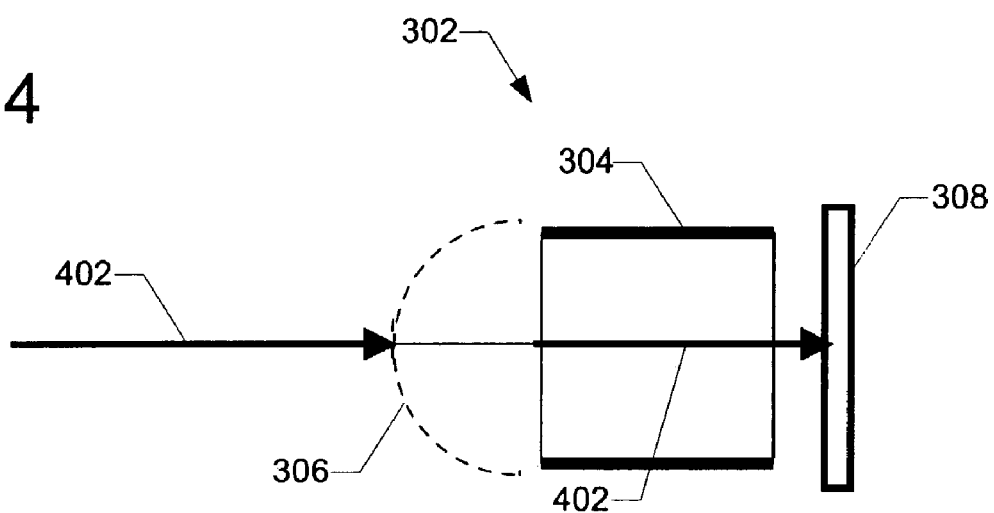
FIG. 4 shows the embodiment of FIG. 3 operating in an electron detection mode.

FIG. 4 shows particle detector 302 of FIG. 3 but operated in an electron detection mode. In electron detection mode, input grid 306 is maintained at an electrical potential of approximately +200 V, which attracts FIB induced secondary electrons 402 from the FIB target. The ion converter cylinder 304 is held at approximately +500 V, which helps transfer the electrons to the scintillator detector 308, which is maintained at a potential of approximately +10,000 V.

Figure 6:
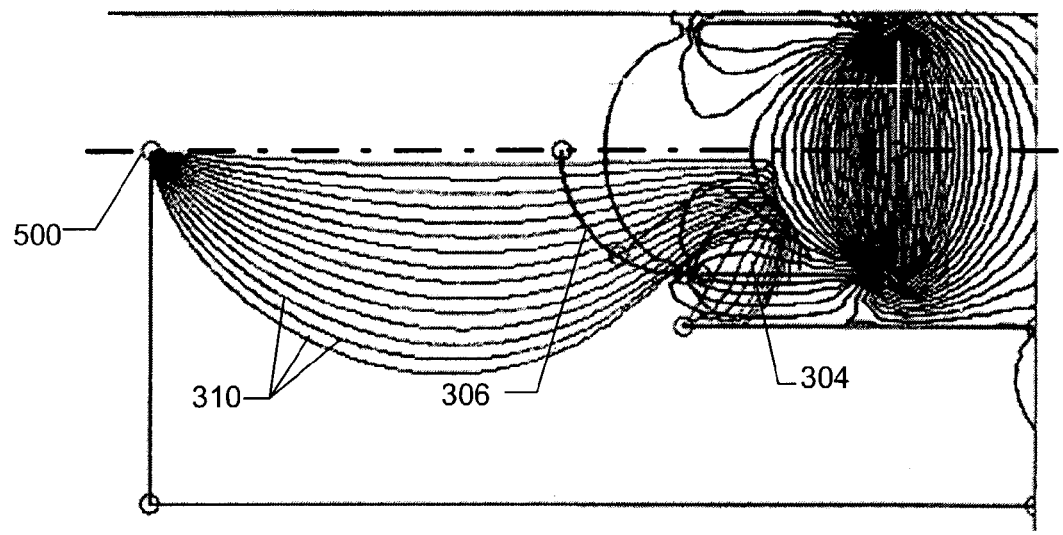
FIG. 6 shows the simulation of FIG. 5 with equipotential lines added.
Figure 5:
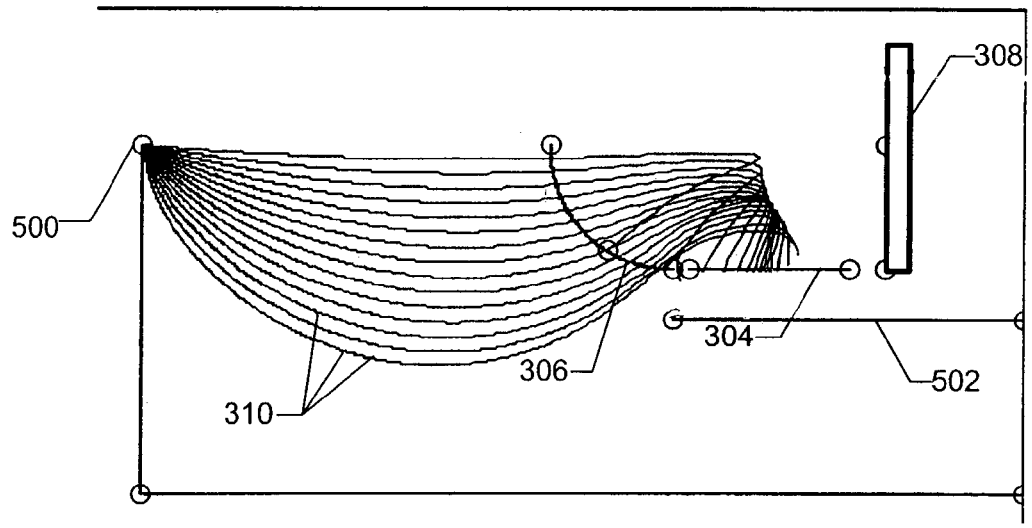
FIG. 5 shows a charged particle optics simulation showing the path of 10 eV ions emitted from a target and impacting on the ion-to-electron converter of FIG. 3.
Figure 7:
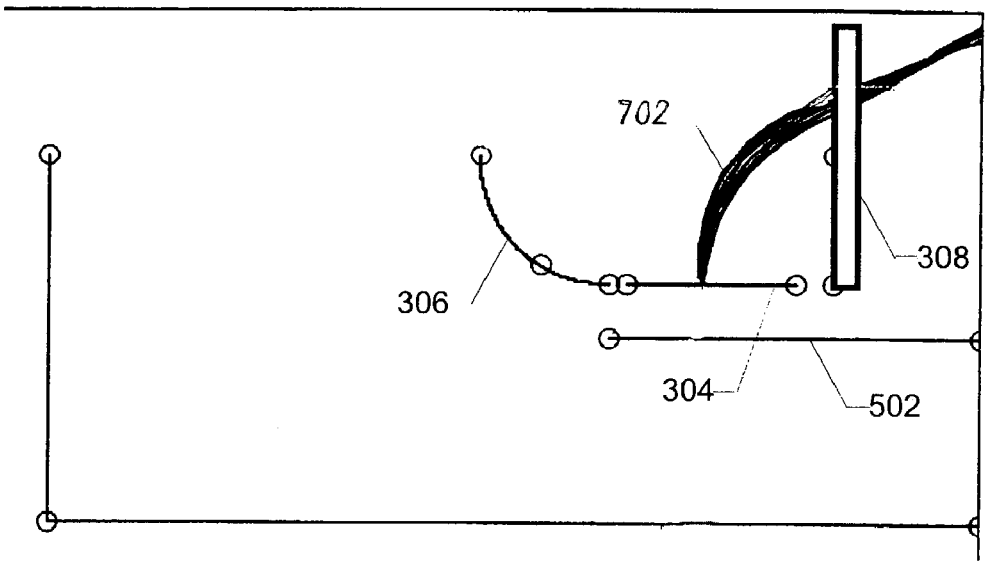
FIG. 7 shows a charged particle optics simulation illustrating the path of electrons emitted when an ion strikes near the center of the converter cylinder of FIG. 3.
Figure 8:
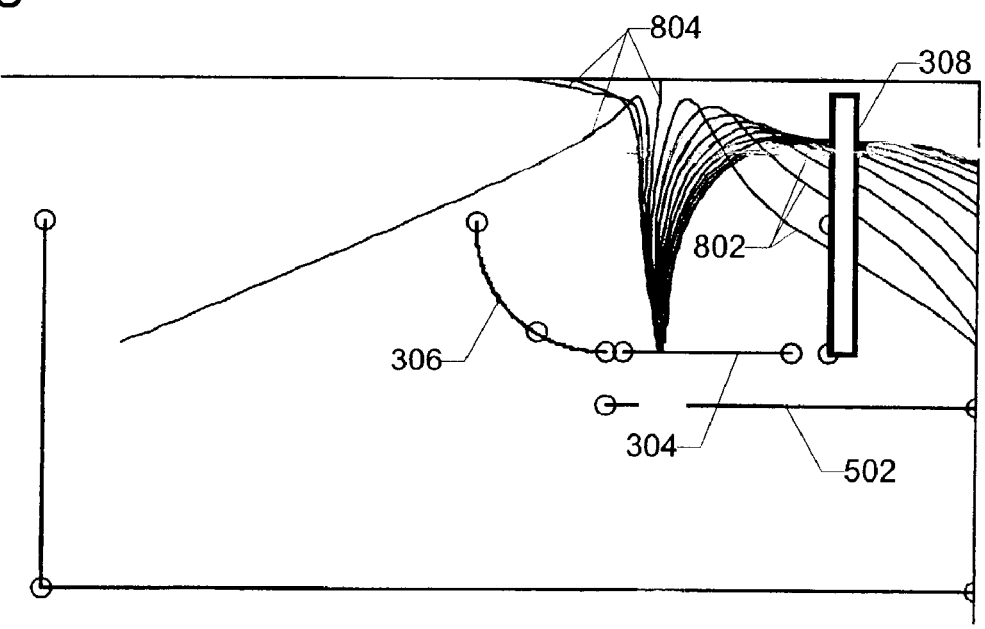
FIG. 8 shows a charged particle optics simulation illustrating the path of electrons emitted when an ion strikes near the input end of the converter cylinder of FIG. 3.
Figure 9:
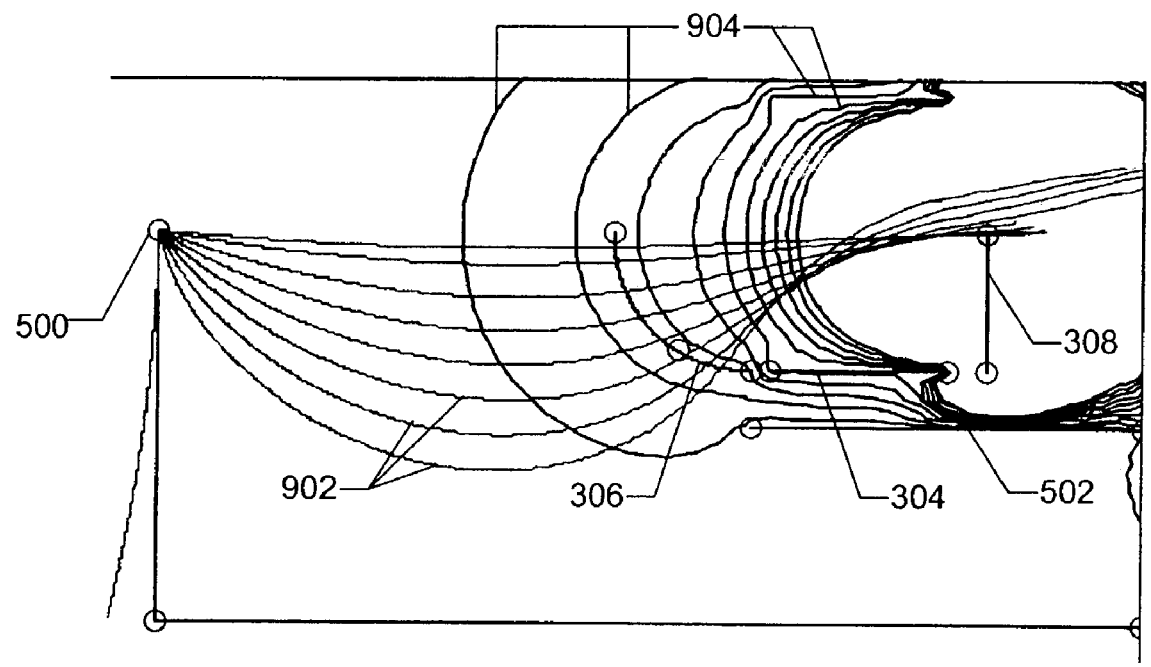
FIG. 9 shows a charged particle optics simulation showing the path of electrons emitted from a target and passing through the ion-to-electron converter of FIG. 3.

FIGS. 5–10 show the results of charged particle beam simulations produced using the Lorentz 2D simulation program from Integrated Engineering Software Sales Inc., Winnipeg, Manitoba, Canada. The detector exhibits circular symmetry, so only trajectories below the centerline are shown in FIGS. 5, 6, and 9 and the top part of cylinders 304 and 502 are not shown.

FIG. 5 shows the simulated trajectories of ions 310 emitted with 10 eV of kinetic energy from the FIB target 500. The ions are emitted in a hemisphere and are attracted to the positively charged input screen 306. FIG. 5 shows that most of the ions impact converter cylinder 304. A grounded cylinder 502 surrounds converter 304 and scintillator 308. FIG. 6 shows the same simulation as shown in FIG. 5, but equipotential lines are added to illustrate the electric fields produced by the various electrical potentials on the input grid 306, the converter cylinder 304, and the scintillator detector 308.

FIGS. 7 and 8 show simulations of the trajectories of electrons that are produced as ions impact different points of the converter cylinder. Electrons 702 are assumed to be emitted uniformly over a hemisphere from the impact point. FIG. 7 shows the trajectories of electrons produced when an ion impacts near the center along the length of converter cylinder 304, and FIG. 8 shows the trajectories of electrons produced when an ions impacts near the input end of the converter cylinder 304. FIG. 7 shows that essentially all of the electrons 702 produced when an ion impact near the center of the converter cylinder 304 impact the scintillator detector 308 and are therefore counted. FIG. 8 shows that electrons 802 which impact the scintillator detector comprise more than half of the total electrons generated when ions impact near the input end of the converter cylinder 304. Electrons 804, which miss the scintillator detector 308, make up less than half of the total electrons generated. From these two-dimensional simulations having axial symmetry from the source to the detector, it appears that the electron collection efficiencies of greater than 50% are likely when using particle detector 302. However, lack of electric field symmetry in the target region can degrade this collection efficiency.

FIG. 9 is a simulation showing the trajectories 902 of 10 eV electrons from the FIB target 500 through the particle detector of FIG. 4 operating in electron collection mode. Approximately 100% of the electrons entering from the sample are detected. FIG. 9 also shows equipotential lines 904.

A particle detector of the present invention can be produced by simply adding a converter cylinder between the input screen and scintillator disk of an existing scintillator detector. The detector can be mounted on a separate flange between the scintillator flange and the system vacuum chamber flange. Adding the ion-to-electron conversion section does not degrade electron collection efficiency and appears to have about twenty five percent efficiency for ion detection if one includes an estimated 50% ion-to-electron conversion efficiency at the converter surface. The efficiency will vary with the type of ions, their energies, the geometry of the system, and the voltages used. Material sputtered from the sample by the primary ion beam could deposit on the converter cylinder and affects its efficiency over time. The design can be readily optimized for a particular application by simulations and experimentation.

The ion and electron detection efficiencies are adequate for most focused ion beam applications, and therefore allow such a system to replace a channel detector or a channel plate detector with a more robust detector, such as a scintillator detector. Embodiments of the invention can be readily switchable from ion detection mode to electron detection mode by simply changing the voltages on the components as described above, without any physical rearrangement of the components. While the invention is described with voltages for detecting electrons and positive ions, appropriate voltages can be determined for detecting negative ions, with optional additional components to exclude the electrons. In some configuration, electrons impacting the ion-to-electron converter can cause additional electrons to be ejected and collected by the scintillator detector.

The invention has broad applicability and can provide many benefits as described and shown in the examples above. The embodiments will vary greatly depending upon the specific application, and not every embodiment will provide all of the benefits and meet all of the objectives that are achievable by the invention. While particularly useful because it allows efficient detection of both ion and electrons and allows the use of a robust scintillator detector, the invention can be used to detections alone and can be used with any type of electron detector to detect the "converted" particles.

Although the present invention and its advantages have been described in detail, it should be understood that various changes, substitutions and alterations can be made herein without departing from the spirit and scope of the invention as defined by the appended claims. For example, types of electron detectors other than a scintillator detector could also be used. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A charged particle detector suitable for use in a focused ion beam system including a focused ion beam that can be directed to a target and that produces secondary particles upon impact of the ion beam with the target, the charged particle detector comprising:
   an input screen to which voltages can be selectively applied relative to the target so as to attract positive or negative secondary charged particles emitted from the target;
   an ion-to-electron converter including a material that emits electrons when impacted by charged particles from the target, said ion-to-electron coverter being configurable in a first configuration to convert ions and configurable in a second configuration to pass electrons from the target through the ion-to-electron converter; and
   a scintillator detector for detecting electrons originating at the target and passing through the ion-to-electron converter or electrons originating in the ion-to-electron converter, the ion-to-electron converter being positioned between the input screen and the scintillator detector.

2. The apparatus of claim 1 in which the ion-to-electron converter is configurable in the first configuration or the second configuration solely by altering one or more voltages on components of the ion-to-electron converter.

3. The apparatus of claim 1 further comprising a voltage source for applying a first voltage to the ion-to-electron converter for attracting positively charged ions from the target and causing the positively charged ions to impact the ion-to-electron converter and generate electrons for detection by the scintillator detector and for applying a second voltage to the ion-to-electron detector for passing electrons from the target through the ion-to-electron detector to the scintillator detector.

4. The apparatus of claim 1 further comprising a voltage source for applying a first voltage to the input screen for attracting positively charged ions from the target and for applying a second voltage to the input screen for attracting positively charged ions from the target.

5. The apparatus of claim 1 in which the ion-to-electron converter comprises generally parallel plates, the major planes of the plates being approximately parallel to the direction of motion of the incoming charged particles.

6. The apparatus of claim 1 in which the ion-to-electron converter comprises a hollow, generally cylindrical structure.

7. The apparatus of claim 1 in which the ion-to-electron converter comprises aluminum or stainless steel.

8. A focused ion beam system, comprising:
   an ion source;
   ion optics for focusing ions from the ion source into an ion beam and directing it towards a target; and a charged particle detector in accordance with claim 1 for detecting secondary positive ions or secondary electrons emitted from the target as a result of the impact of the ion beam.

9. The apparatus of claim 8 in which the ion-to-electron converter is configurable in a first configuration to convert ions emitted from a target to electrons for detection by the electron detector and configurable in a second configuration to pass electrons from the target through the ion-to-electron converter for detection by the electron detector.

10. The apparatus of claim 8 in which the ion-to-electron converter comprises a hollow, generally cylindrical structure.

11. The apparatus of claim 8 in which the ion-to-electron converter comprises aluminum or stainless steel.

12. An ion-to-electron converter for use with an electron detector to detect ions originating from a target by causing the ions to generate electrons to be detected by the electron detector, the ion-to-electron converter comprising a material that when struck by an ion generates electrons for detection and having a structure such that when a first voltage is applied to the ion-to-electron converter, ions are attracted to the ion-to-electron converter, collide with a surface of the ion-to-electron converter, and generate electrons that are detected by the electron detector, and when a second voltage is applied, electrons pass through the ion-to-electron converter and are detected by the electron detector, the ion-to-electron converter adapted to be positioned between an input electrode and the electron detector.

13. The ion-to-electron converter of claim 12 in which the electron detector comprises a scintillator detector.

14. The ion-to-electron converter of claim 12 in which the ion-to-electron converter has a shape approximating a hollow cylinder.

15. The ion-to-electron converter of claim 12 in which the ion-to-electron converter comprises multiple parallel plates.

16. The ion-to-electron converter of claim 12 in which the ion-to-electron converter comprises aluminum or stainless steel.

17. A method of detecting positive or negative charged particles, comprising
selectively attracting positive ions or electrons from a target using an input electrode;
if positive ions are selectively attracted, converting the positive ions to electrons by causing the positive ions to impact on a surface not part of the input electrode, the impact causing the emission of electrons; and
detecting using an electron detector either the electrons emitted by the impact of the positive ions from the surface or electrons selectively attracted from the target and not impacting the surface.

18. The method of claim 17 in which converting the positive ions to electrons by causing the positive ions to impact on a surface includes causing the positive ions to impact on a generally cylindrical surface.

19. The method of claim 17 in which converting the positive ions to electrons by causing the positive ions to impact on a surface includes causing the positive ions to impact on the surfaces of multiple generally parallel plates.

20. The method of claim 17 in which converting the positive ions to electrons by causing the positive ions to impact on a surface includes causing the positive ions to impact on a surface comprising aluminum oxide or stainless steel.

21. A charged particle detector suitable for use in a focused ion beam system including a focused ion beam that can be directed to a target and that produces secondary particles upon impact of the ion beam with the target, the charged particle detector comprising:
an input screen to which voltages can be selectively applied relative to the target so as to attract positive or negative secondary charged particles emitted from the target;
an ion-to-electron converter having at least one surface comprising a material that emits electrons when impacted by charged particles from the target, said ion-to-electron converter being configurable in a first configuration to convert ions emitted from a target to electrons and configurable in a second configuration to pass substantially all of the electrons traveling from the target through the ion-to-electron converter without impacting said surface of the ion-to-electron converter, the ion-to-electron converter not being the input screen; and
a scintillator detector for detecting electrons originating at the target and passing through the ion-to-electron converter or electrons originating in the ion-to-electron converter.

* * * * *